United States Patent
Hwang et al.

(10) Patent No.: US 8,183,473 B2
(45) Date of Patent: May 22, 2012

(54) OPTIMIZED POWER PACKAGE FOR ELECTRICAL DEVICE

(75) Inventors: Gyu Man Hwang, Yongin-si (KR); Dae Hyeong Lee, Seoul (KR); Bong Gyun Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 339 days.

(21) Appl. No.: 12/591,408

(22) Filed: Nov. 18, 2009

(65) Prior Publication Data

US 2011/0061929 A1    Mar. 17, 2011

(30) Foreign Application Priority Data

Sep. 15, 2009   (KR) ........................ 10-2009-0087107

(51) Int. Cl.
   *H05K 7/02*    (2006.01)
(52) U.S. Cl. ........................................ 174/541; 174/548
(58) Field of Classification Search .................. 174/541, 174/548, 535
   See application file for complete search history.

(56) References Cited

U.S. PATENT DOCUMENTS

| 6,548,895 | B1 * | 4/2003 | Benavides et al. | 257/712 |
| 6,788,171 | B2 * | 9/2004 | Ammar et al. | 333/247 |
| 6,888,235 | B2 * | 5/2005 | Lopata et al. | 257/691 |
| 7,518,201 | B2 * | 4/2009 | Stelzl et al. | 257/416 |
| 2008/0019106 | A1 * | 1/2008 | Wetzel et al. | 361/752 |
| 2008/0308822 | A1 * | 12/2008 | Tsang et al. | 257/89 |
| 2009/0135043 | A1 * | 5/2009 | Leblanc et al. | 342/1 |
| 2011/0036176 | A1 * | 2/2011 | Bradley et al. | 73/756 |

FOREIGN PATENT DOCUMENTS

KR    10-1997-0003880    1/1997

* cited by examiner

*Primary Examiner* — Hung Ngo

(57) ABSTRACT

Disclosed is a power package for an electrical device of an Electronic Control Unit (ECU) in an Electric Power Steering (EPS) system, the power package including: a housing which is formed with an upper part and a lower part and is formed to be in a two-step structure where substrate layers are provided on each of the upper and lower parts; a Printed Circuit Board (PCB) layer which is provided on the lower part of the housing and has a path line formed thereon to flow a current; and an LTCC layer which is provided on the upper part of the housing, is connected to the PCB layer through wire-bonding, and is formed of a Low Temperature Co-fired Ceramics. The power package for an electrical device can expand areas of the PCB and LTCC layers, thereby enhancing freedom degree of design of the PCB and LTCC layers and reducing a size of the entire case.

5 Claims, 4 Drawing Sheets

[FIG. 1]
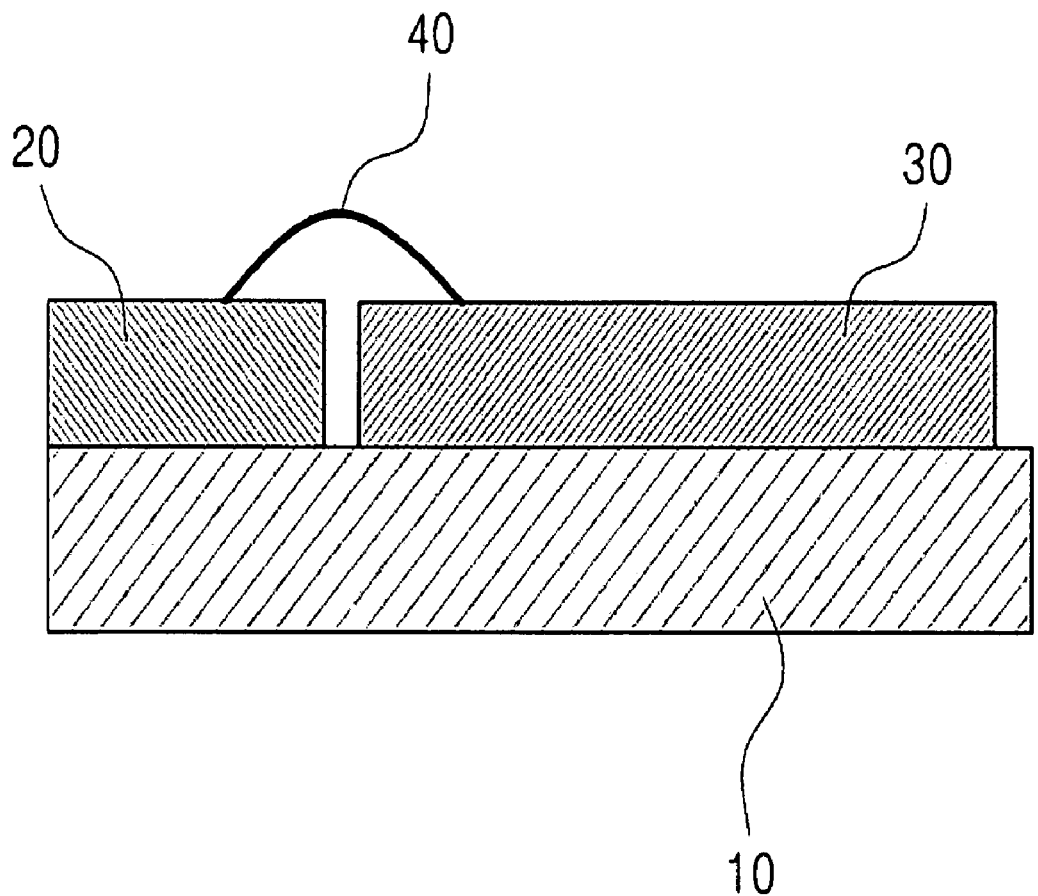
- PRIOR ART -

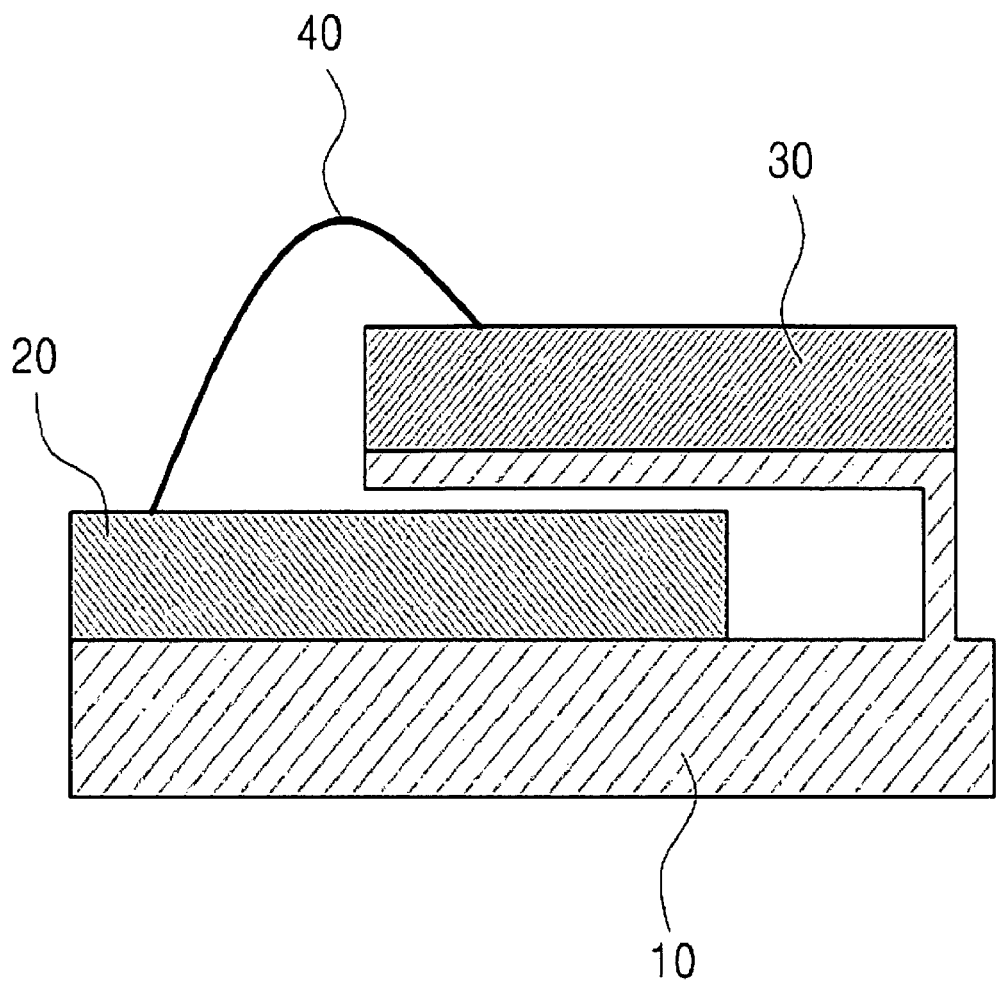
[FIG. 2]

[FIG. 3]
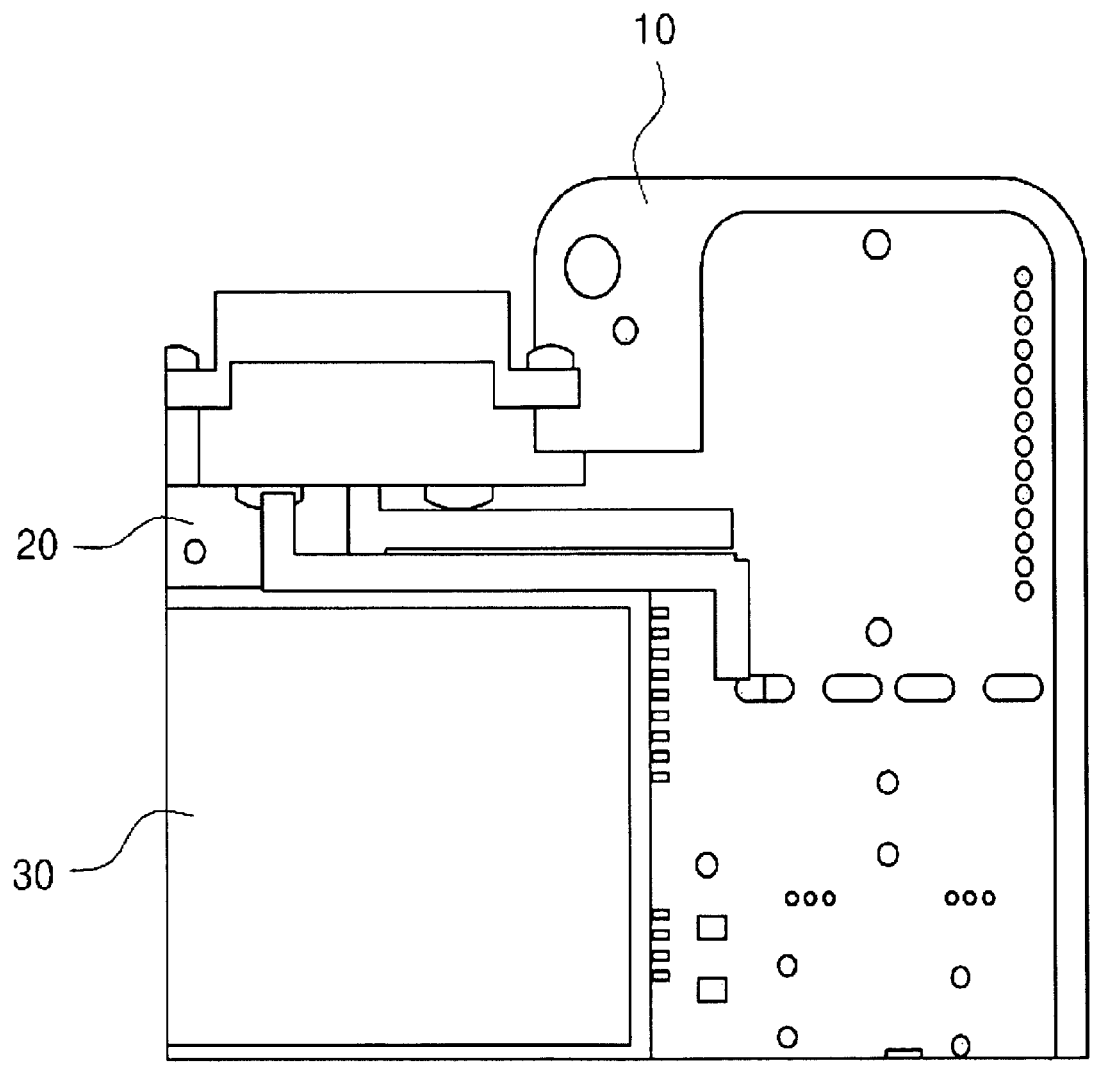

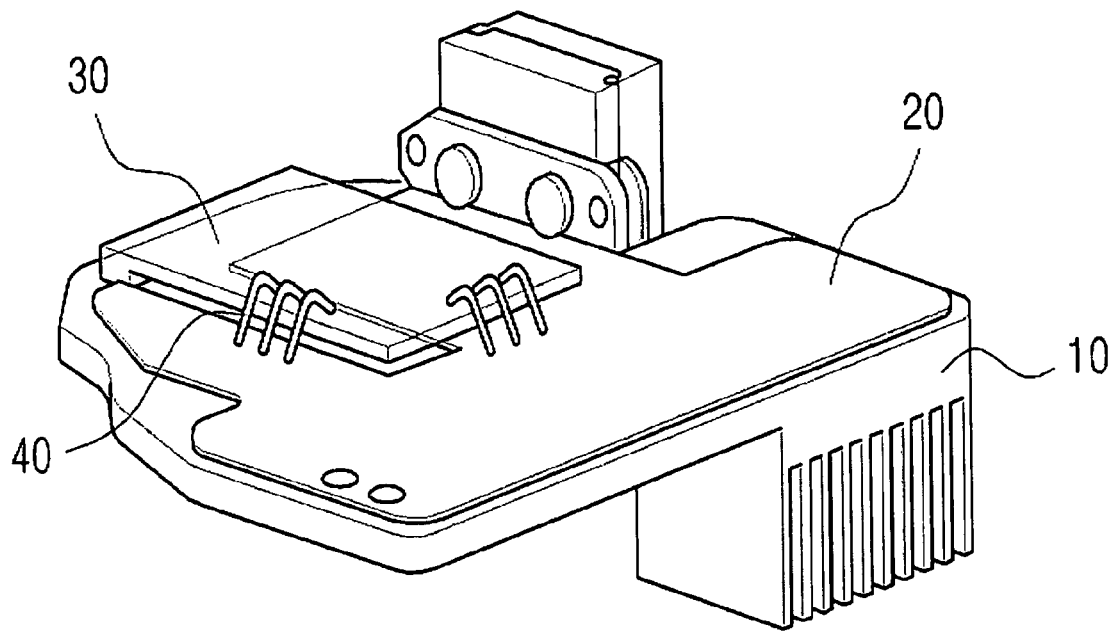
[FIG. 4]

OPTIMIZED POWER PACKAGE FOR ELECTRICAL DEVICE

CROSS-REFERENCE TO RELATED APPLICATIONS

This application claims the benefit of Korean Patent Application No. 10-2009-0087107 filed with the Korea Intellectual Property Office on Sep. 15, 2009, the disclosure of which is incorporated herein by reference.

BACKGROUND OF THE INVENTION

1. Field of the Invention

The present invention relates to an optimized power package for an electrical device; and, more particularly, to an optimized power package for an electrical device of an Electronic Control Unit (ECU) in an Electric Power Steering (EPS) system, in which it is possible to expand areas of a PCB layer and an LTCC layer, to enhance the freedom degree of design of the PCB and LTCC layers, and to reduce a size of the entire case.

2. Description of the Related Art

With the recent development of electrical device modules, users have gradually demanded for miniaturization and high-performance of the modules. In line with the trend, there has been also a need of miniaturization and high-performance of parts used in the modules.

However, in the prior art, since parts to be mounted are positioned on a planar Printed Circuit Board (PCB), there has been a limit to the number of the mounted parts on the planar PCB. Further, when an over-current flows to a path line on the PCB, high-temperature heat is produced due to miss-matching, which results in low reliability.

In order to solve these problems, a Low Temperature Co-fired Ceramics (LTCC) has been used. An LTCC element is known generically as an element manufactured by co-firing both of a metal electrode and a ceramic substrate at a temperature of less than 1,000° C. lowered by 200° C. or higher than a firing temperature widely used at ceramics-firing.

The LTCC element provides higher mounting density and more effectively emits heat generated in an IC, in comparison with the PCB, so it is being used as a passive element for high-frequency communication and a control module for an electrical device.

However, as an LTCC is very expensive, costs to manufacture a substrate with the LTCC is increased. Thus, as shown in FIG. 1, there has been presented a proposal of using an LTCC layer 30 together with a PCB layer 20. The LTCC layer 30 and PCB layer 20 are positioned on the substrate 10 and interconnected with the wire bonding 40. However, whenever the LTCC layer 30 together with the PCB layer 20 are used on the same plane, areas of the LTCC 30 and PCB 20 layers become relatively reduced, which results in restriction on not only its design, but the number of elements to be mounted as well.

An electrically-powered EPS system electrically controls steering torque of a handle depending on traveling speed of a vehicle. In particular, the electrically-powered EPS system allows the steering torque to be light at parking or low-speed traveling, and allows the steering torque to be heavy at high-speed traveling, thereby enabling the driver to stably travel at high speed. That is, the EPS system aims to improve vehicle's mileage and cope with an electrical vehicle.

Advantages of the EPS system include reduction in vehicle's weight, and improvement (3 to 5%) of vehicle's mileage due to prevention of power loss. Moreover, the EPS system has advantages of less consumed maintenance and environmentally-friendly characteristics. Furthermore, as for other advantages of the EPS system, there are miniaturization and improved assembly due to a reduction in the number of parts used in the EPS, accurate control of the steering torque for each speed of the vehicle, improvement of steering performance resulting from improved stability of high-speed traveling, and so.

The EPS system includes three circuits around a micro computer; an input circuit of vehicle's speeds and two-based steering torques, a driving circuit of a motor, and a detecting/monitoring circuit of a motor current and a voltage. In the EPS system, the micro computer determines an assist amount by torque and vehicle-speed signals and calculates location of a rotor (rotation sensor) and reference currents, which flow to each of three phases by actual currents of the motor. Then, a three phase-Pulse-Width Modulation (PWM) circuit outputs signals to each phase of the motor, and thus the motor is driven while the power steering is achieved.

In particular, because interference between other parts is caused when an ECU of an EPS system is mounted on a vehicle, its housing becomes gradually downsized.

In addition, the housing's size is definitely set at an initial stage, so parts such as a connector, and so on are designed and arranged on a PCB layer and an LTCC layer positioned at defined areas in a two-dimensional plane. Therefore, a reduction in areas of the LTCC and PCB layers reduces a path line on which currents flow, as well as the number of the parts to be mounted. Therefore, flow of over-currents to the reduced path line results in mis-matching. This is because, since a line width of 0.1 mm is required per a current of 1 A, a path line width of about 10 cm is required for a current of 90 A. This means that it is impossible to properly implement a path line on a conventional PCB layer.

Additionally, it is necessary to secure such a space that a number of parts can be mounted on the LTCC layer, and such a minimum area that a bonding pad signal-connected to the PCB layer is provided on the LTCC layer. However, in case where the LTCC and PCB layers are implemented on the same plane, it is difficult to secure the mounting space and the minimum area.

Moreover, in case where the LTCC layer has a narrow area, a defective rate is increased at wire-bonding.

SUMMARY OF THE INVENTION

The present invention has been proposed in order to overcome the above-described problems and it is, therefore, an object of the present invention to provide an optimized power package for an electrical device, in which a PCB layer is used together with an LTCC layer, so it is possible to expand areas of the PCB and LTCC layers.

In accordance with one aspect of the present invention to achieve the object, there is provided a power package for an electrical device of an Electronic Control Unit (ECU) in an Electric Power Steering (EPS) system, the power package including: a housing which is formed with an upper part and a lower part and is formed to be in a two-step structure where substrate layers are provided on each of the upper and lower parts; a Printed Circuit Board (PCB) layer which is provided on the lower part of the housing and has a path line formed thereon to flow a current; and an LTCC layer which is provided on the upper part of the housing, is connected to the PCB layer through wire-bonding, and is formed of a Low Temperature Co-fired Ceramics.

Herein, the lower part of the housing is coupled with the PCB layer through a fastener.

The fastener corresponds to a bolt and a nut.

The upper part of the housing is coupled with the LTCC layer through thermal grease.

A heat-resistant element is allowed to be mounted on the PCB layer and a heat-emission element is allowed to be mounted on the LTCC layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a view showing a state where an LTCC and a PCB are disposed on the same plane in two dimension;

FIG. 2 is a view showing a state where an LTCC and a PCB are disposed in a two-step structure in accordance with an embodiment of the present invention;

FIG. 3 is a plane-view showing a state where an LTCC and a PCB are disposed on the same plane; and FIG. 4 is a perspective view of a power package for an electrical device.

DETAILED DESCRIPTION OF THE PREFERABLE EMBODIMENTS

Embodiments of an optimized power package for an electrical device in accordance with the present invention will be described in detail with reference to the accompanying drawings. When describing them with reference to the drawings, the same or corresponding component is represented by the same reference numeral and repeated description thereof will be omitted.

Hereinafter, preferable embodiments of the present invention will be described in more detail with reference to accompanying drawings.

FIG. 2 is a view showing a state where a 2-step structured housing has LTCC layer 30 and PCB layer 20 formed on each of lower and upper parts thereof and the LTCC 30 and PCB 20 layers are boned through a wire 40.

As shown in FIG. 2, the housing includes an upper part and a lower part, and each of two parts may have a substrate layer formed 10 thereon.

That is, when the LTCC 30 and PCB 20 layers are provided on the same plane as shown in FIG. 1, due to a limited area of the housing, there has been a limitation to an area where each layer is to be formed. However, the housing is formed to have two-step structure of the lower and upper parts, so it is possible to form a substrate layer 10 on each of the upper and lower parts, and thus to enlarge an area of the LTCC 30 and PCB 20 layers.

Also, the LTCC layer 30 is connected to the PCB layer 30 through wire bonding 40. With enlargement of the area of the LTCC 30 and PCB 20 layers, it is possible to more easily bond the LTCC layer 30 to the PCB layer 20.

Moreover, as the lower part is allowed to have a wider area than that of the upper part, relatively expensive LTCC layer 30 is provided on the upper part and the relatively cheap PCB layer 20 is provided on the lower part.

Furthermore, as the upper part is allowed to have a small area, the housing may be formed to be stable in the triangular shape.

The PCB layer 20 provided on the lower part of the housing is coupled with the housing through a fastener.

As for the fastener used herein, a bolt and a nut may be exemplified.

Coupled with the PCB layer 20 through the bolt and the nut, the housing is provided with a hole through which the bolt is fastened with the nut.

The LTCC layer 30 provided on the upper part of the housing is coupled by thermal grease. That is, adhesive strength by the thermal grease enables the LTCC layer 30 to be coupled with the upper part of the housing.

In the housing structured as above, a heat-resistant element is mounted on the PCB layer 20, and a heat-emission element is mounted on the LTCC layer 30. Since the PCB layer 20 is more sensitive to heat than the LTCC layer 30, an element resistant to heat is allowed to be mounted on the PCB layer 20. On the contrary, a heat-emission element for emitting heat is allowed to be mounted on the LTCC layer 30 resistant to heat. Therefore, it is possible to provide improved stability.

FIG. 3 is a plane-view showing a state where an LTCC layer 30 and a PCB layer 20 are positioned on the same plane. As shown in FIG. 3, as the LTCC layer 30 and the PCB layer 20 are positioned on the same plane, an area of each of two layers is reduced. In particular, when one portion where the PCB layer 20 is formed is narrow, a path line the on the PCB layer 20 is also formed to be narrow.

However, referring to FIG. 4, which is a perspective view of a housing having a two-step structure of the upper and lower parts, the housing has a three dimensional structure obtained by coupling the PCB layer 20 with the lower part of the housing through a fastener and coupling the LTCC layer 30 with the upper part of the housing through thermal grease.

That is, as the housing is formed to have the three dimension structure rather than a plane of being a two dimension structure, it is possible to prevent areas where the LTCC 30 and PCB 20 layers are positioned on the same plane from being reduced. In other words, if the PCB layer 20 formed to be narrow is provided on the two-step structured housing of the present invention, it is possible to provide an effect of expanding the area. Thus, it is possible to increase the number of the parts to be mounted, as well as to enlarge an area of a path line. In addition, the LTCC 30 and PCB 20 layers are interconnected by wire-bonding 40, which results in enlargement of the areas and reduction in a defective rate caused by bonding.

According to the present invention, each of the PCB layer and the LTCC layer can be formed to be in a two-step structure, so that it is possible to enlarge respective areas.

Thus, it is possible to enhance the freedom of designing of the PCB and the LTCC.

Moreover, since an area of the PCB layer is wide enough to secure, lay-out design and production may be made even if many parts cause complexity of signaling-connection. Furthermore, even if over-currents flow to the path line, high-temperature heat is not generated due to mis-matching. Therefore, it is possible to prevent deterioration of reliability.

Also, as an area of the LTCC layer is wide enough to secure, lay-out design and production may be made even if the number of parts to be mounted is increased.

Also, since an area of bonding pads signal-connected to the PCB and a distance between the pads are sufficiently provided, it is possible to prevent a tool from being defective due to bonding error and bonding tool interference.

Also, it is possible to downsize the entire case by separation of the PCB layer and the LTCC layer.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A power package for an electrical device of an Electronic Control Unit (ECU) in an Electric Power Steering (EPS) system, the power package comprising:
   a housing which is formed with an upper part and a lower part and is formed to be in a two-step structure where substrate layers are provided on each of the upper and lower parts;
   a Printed Circuit Board (PCB) layer which is provided on the lower part of the housing and has a path line formed thereon to flow a current; and
   an LTCC layer which is provided on the upper part of the housing, is connected to the PCB layer through wire-bonding, and is formed of a Low Temperature Co-fired Ceramics.

2. The power package of claim 1, wherein the lower part of the housing is coupled with the PCB layer through a fastener.

3. The power package of claim 2, wherein the fastener corresponds to a bolt and a nut.

4. The power package of claim 1, wherein the upper part of the housing is coupled with the LTCC layer through thermal grease.

5. The power package of claim 1, wherein a heat-resistant element is allowed to be mounted on the PCB layer and a heat-emission element is allowed to be mounted on the LTCC layer.

* * * * *